US009627541B2

United States Patent
Li et al.

(10) Patent No.: US 9,627,541 B2
(45) Date of Patent: Apr. 18, 2017

(54) NON-PLANAR TRANSISTOR AND METHOD OF FORMING THE SAME

(71) Applicant: UNITED MICROELECTRONICS CORP., Hsin-Chu (TW)

(72) Inventors: Jhen-Cyuan Li, New Taipei (TW); Nan-Yuan Huang, Tainan (TW); Shui-Yen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/741,464

(22) Filed: Jun. 17, 2015

(65) Prior Publication Data

US 2016/0336451 A1 Nov. 17, 2016

(30) Foreign Application Priority Data

May 15, 2015 (TW) .............................. 104115466 A (51) Int. Cl.
| | |
|---|---|
| *H01L 29/78* | (2006.01) |
| *H01L 29/06* | (2006.01) |
| *H01L 29/66* | (2006.01) |
| *H01L 29/165* | (2006.01) |

(52) U.S. Cl.
CPC ...... *H01L 29/7853* (2013.01); *H01L 29/0653* (2013.01); *H01L 29/66795* (2013.01); *H01L 29/7851* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 7,470,570 B2 | 12/2008 | Beintner et al. | |
| 8,772,860 B2 | 7/2014 | Huang et al. | |
| 9,287,403 B1 * | 3/2016 | Lee | H01L 29/7851 |
| 2011/0101421 A1 | 5/2011 | Xu | |
| 2015/0145067 A1 | 5/2015 | Liao | |
| 2015/0236015 A1 * | 8/2015 | Jeong | H01L 27/0886 257/401 |
| 2016/0093720 A1 * | 3/2016 | Chudzik | H01L 29/66795 438/157 |
| 2016/0141384 A1 * | 5/2016 | Lee | H01L 29/7833 438/275 |

* cited by examiner

*Primary Examiner* — Charles Garber
*Assistant Examiner* — Steven Christopher
(74) *Attorney, Agent, or Firm* — Winston Hsu; Scott Margo (57) ABSTRACT

A non-planar transistor is provided. It includes a substrate, a fin structure, a gate structure, a spacer structure and a source/drain region. The fin structure is disposed on the substrate, the gate structure is disposed on the fin structure. The spacer structure is disposed on a sidewall of the gate structure. The spacer structure includes a first spacer with a first height and a second spacer with a second height, wherein the first spacer is disposed between the second spacer, and the first height is different from the second height. The source/drain region is disposed in a semiconductor layer at two sides of the spacer structure. The present invention further provides a method of forming the same.

9 Claims, 9 Drawing Sheets

FIG. 14

NON-PLANAR TRANSISTOR AND METHOD OF FORMING THE SAME

BACKGROUND OF THE INVENTION

1. Field of the Invention

The present invention is related to a non-planar transistor and a method of forming the same, and more particularly, to a non-planar structure with a novel fin structure and a novel spacer structure and a method of forming the same.

2. Description of the Prior Art

In recent years, as various kinds of consumer electronic products have been constantly developed towards miniaturization and the size of semiconductor components has reduced accordingly, in order to meet requirements of high integration, high performance, low power consumption, and demands for the products.

However, with the miniaturization development of the electronic products, current planar transistors no longer meet the requirements of the products. Non-planar transistors, such as fin field effect transistors (Fin-FET), have been therefore to obtain a high drive current and to lessen short channel effect. However, due to the three-dimensional structure of the Fin-FET, a lot of drawbacks raises as well. For example, in conventional Fin-FET, the fin structure includes a corner with a nearly 90 degrees, which may result in uneven voltage distribution through the channel. Consequently, the quality of the Fin-FET is affected.

Therefore, there is still a need for a novel FET structure and a method of making the same.

SUMMARY OF THE INVENTION

The present invention therefore provides a novel non-planar transistor and a method of forming the same.

According to one embodiment, a non-planar transistor is provided. It includes a substrate, a fin structure, agate structure, a spacer structure and a source/drain region. The fin structure is disposed on the substrate, the gate structure is disposed on the fin structure. The spacer structure is disposed on a sidewall of the gate structure. The spacer structure includes a first spacer with a first height and a second spacer with a second height, wherein the first spacer is disposed between the second spacer, and the first height is different from the second height. The source/drain region is disposed in a semiconductor layer at two sides of the spacer structure.

According to another embodiment, a method of forming a non-planar transistor is provided. First, a fin structure is formed on a substrate, and a gate structure on the fin structure. A spacer structure is on a sidewall of the gate structure, wherein the spacer structure comprises a first spacer having a first height and a second spacer having a second height, the first spacer is disposed between the gate structure and the second spacer, and the first height is different from the second height. Next, a source/drain region is formed in the fin structure at one side of the spacer structure.

The present invention is featured that the fin structure includes the concave portion to avoid leakage current. Further, the novel spacer structure can control the shape and the size of the semiconductor layer, thereto enhance the electrical performance of the non-planar transistor.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed. The preferred embodiments of the present invention are illustrated in the accompanying drawings with numbered elements.

Figure 1:
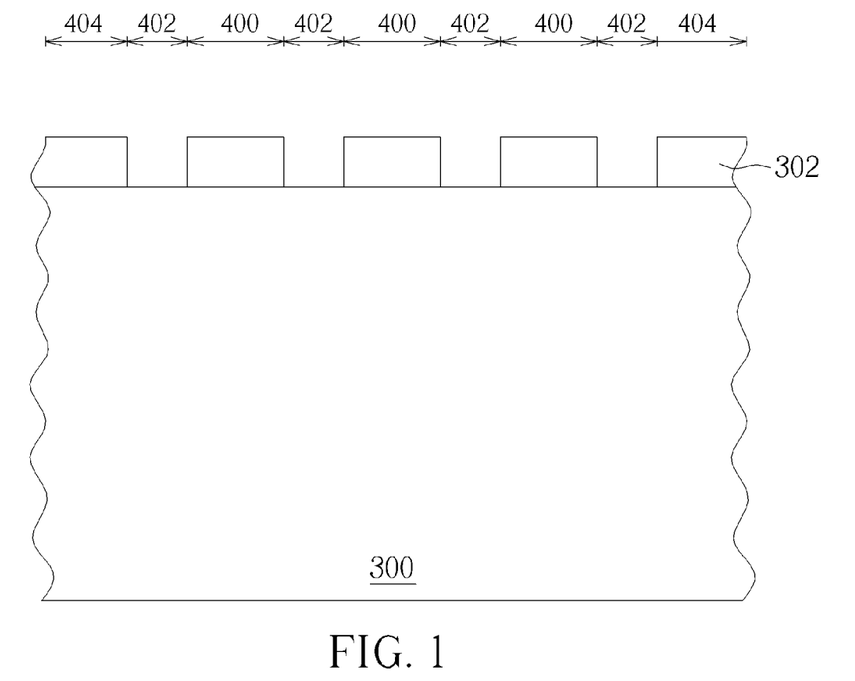
FIG. 1 to FIG. 8 show schematic diagrams of the method of forming a non-planar transistor according to one embodiment of the present invention.

Please refer to FIG. 1 to FIG. 8, showing schematic diagrams of the method of forming a non-planar transistor according to one embodiment of the present invention. As shown in FIG. 1, a semiconductor substrate 300 is provided to serve as a base for forming devices, components, or circuits. The substrate 300 is preferably composed of a silicon containing material. Silicon containing materials include, but are not limited to, Si, single crystal Si, poly-crystalline Si, SiGe, single crystal silicon germanium, poly-crystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, are also suitable for the semiconductor substrate 300. A plurality of active regions 400, an isolation region 402, and a peripheral region 404 are defined on the substrate 300, wherein the isolation region 402 encompasses each active region 400 and the peripheral region 404 refers to the region outside the active regions 400 and the isolation region 402. In the subsequent steps, at least a non-planar transistor such as a fin-FET will be formed in the active regions 400, and a shallow trench isolation (STI) will be formed in the isolation region 402. It is noted that the present embodiment shows that three active regions 400 are encompassed by one isolation region 402, but in another embodiment, one or a plurality of active regions 400 can be encompassed by one isolation region 402.

As shown in FIG. 1, a patterned mask layer 302 is formed on the substrate 300. The patterned mask layer 302 is formed on the substrate 300 in the active region 400 and the peripheral region 402, but is not disposed on the substrate 300 in the isolation region 404. In one embodiment, the patterned mask layer 302 comprises silicon nitride (SiN). In another embodiment, the patterned mask layer 302 comprises any material that is suitable for serving as a mask layer, such as silicon carbide (SiC), silicon oxynitride (SiON), or advanced patterned film (APF) provided by the Applied Material Corporation. In one embodiment, an optional liner layer such as a silicon oxide ($SiO_2$) (not shown) can be formed between the substrate 300 and the patterned mask layer 302.

Figure 2:
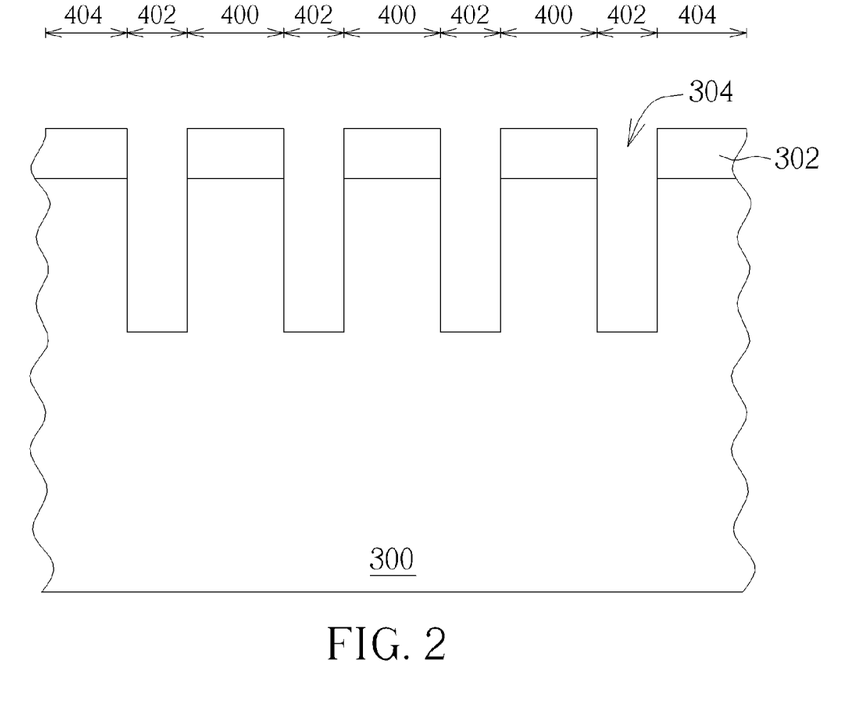

As shown in FIG. 2, an etching process is performed by using the patterned mask layer 302 as a mask to etch the substrate 300, thereby forming a plurality of first trenches 304 in the substrate 300 in the isolation region 402. In one embodiment, the first trench 30r includes a vertical sidewall. In another embodiment, the first trench 304 can have a sidewall shrinking from top to bottom.

Figure 3:
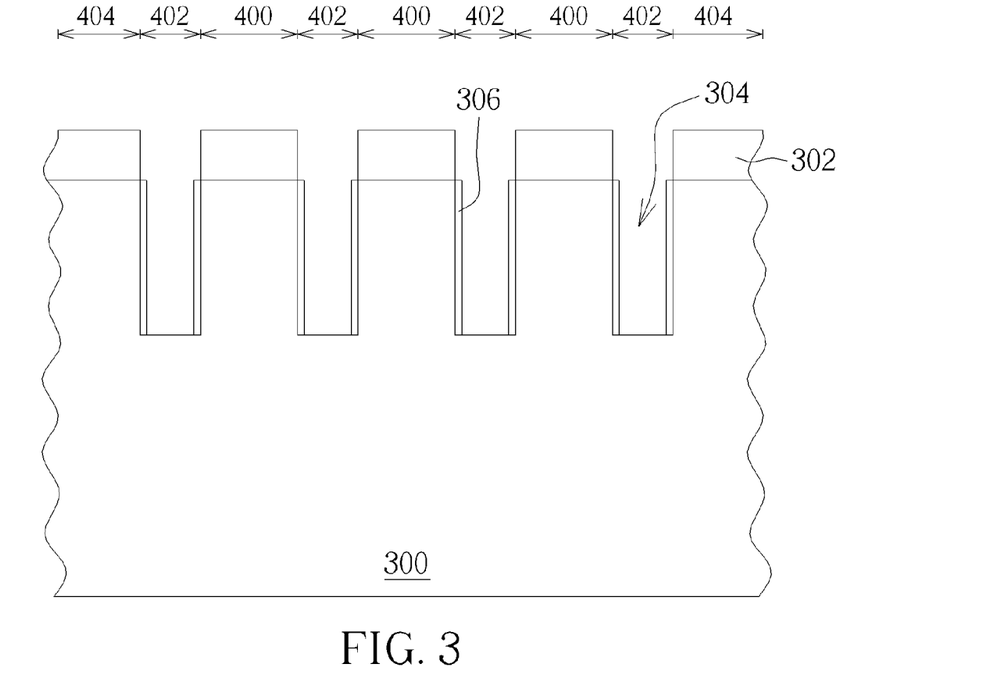

As shown in FIG. 3, a liner layer 306 is formed on the sidewall of the first trench 304. For example, a thermal oxidation step is performed so as to form a liner layer with silicon oxide on the sidewalls and bottom surface of the first trench 304, and then the liner layer on the bottom surface of the first trench 304 is removed, so that the liner layer 306 is formed only on the sidewalls of the first trench 304. In another embodiment of the present invention, the liner layer 306 can be formed by carrying out a chemical vapor deposition (CVD) process to form a material layer, such as silicon nitride layer. Then, an anisotropical etching process is performed to make the material layer having spacer structure, thereby forming said liner layer 306. In another embodiment, the liner layer 306 can be formed by other material or other method and is not limited to above-mentioned process.

Figure 4:
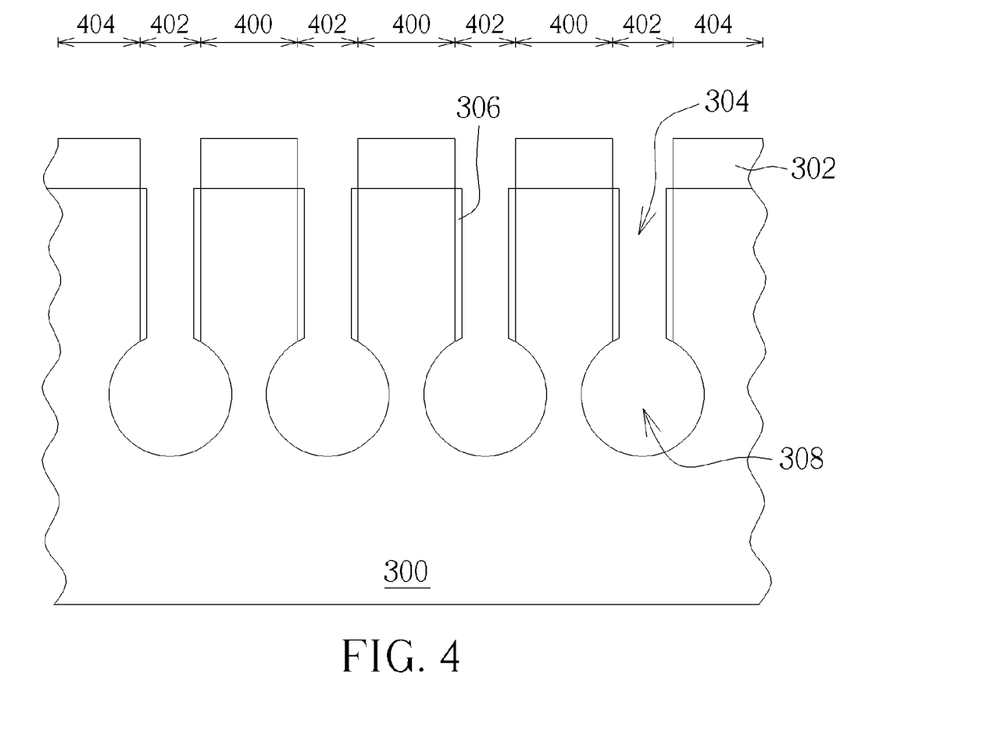

As shown in FIG. 4, the bottom surface of the first trench 304 is isotropically removed, making the first trench 304 extend downwardly and outwardly so as to form a plurality of second trenches 308. In one embodiment of the present invention, the second trenches 308 are preferably formed by a wet etching process, such as using etchant with hydrofluoric acid (HF). Since the sidewall of the first trench 304 is covered by the liner layer 306, it is preferred that the sidewall of the first trenches 304 is not etched, and only the bottom surface thereof is isotropically etched. In one embodiment, the sidewall of the second trench 308 contains an arcuate structure in its cross-section, e.g., circular shape or oval shape.

Figure 5:
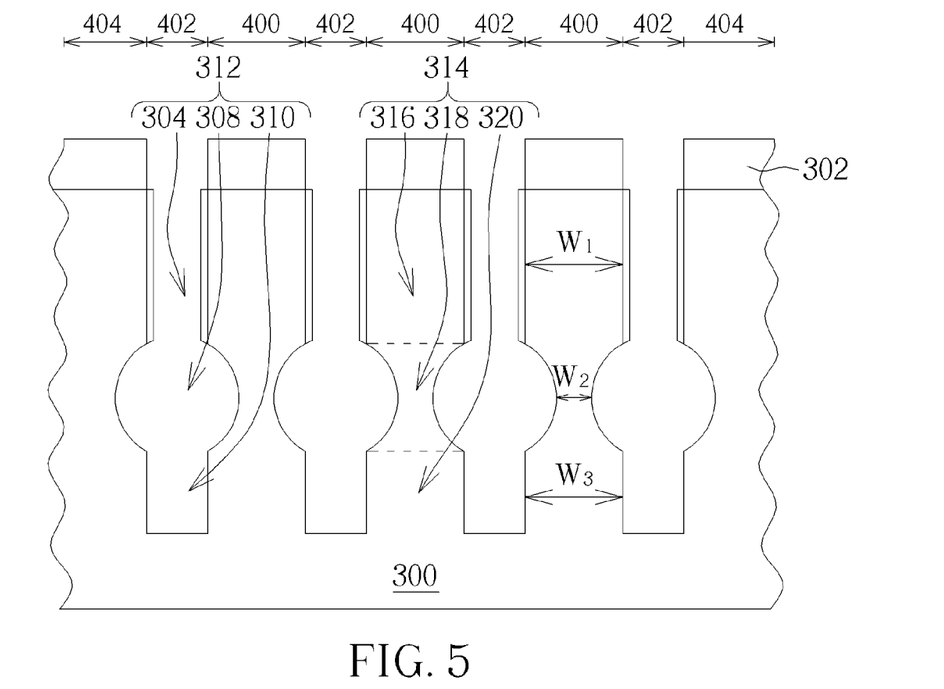

As shown in FIG. 5, the second trenches 308 are deepened so as to form a plurality of third trenches 310 at the bottom of the second trench 308. In one embodiment of the present invention, a dry etching process can be performed by still using the patterned mask layer 302 as a mask to form said third trenches 310. Thus, the first trench 304, the second trench 308 and the third trench 310 together form a shallow trench 312 in the isolation region 402, and a fin structure 314 is formed in the active region 400. As shown in FIG. 5, the fin structure 314 has an upper portion 316 corresponding to the first trench 304, a concave portion 318 corresponding to the second trench 308 and a lower portion 320 corresponding to the third trench 310, wherein the upper portion 316 having a first width $W_1$, the concave portion 318 has a second width $W_2$ ($W_2$ is the minimum width of the concave portion 318), the lower portion 320 has a third width $W_3$. In one embodiment, the second width $W_2$ is smaller than the first width $W_1$, and the third width $W_3$ is substantially equal to the first width $W_1$. While in another embodiment, in accordance with the design, the third width $W_3$ can be less than or greater than the first width $W_1$ by adjusting the second trench 308 and the third trench 310. It is worth noting that the concave portion 318 of the fin structure 314 presents a recess sidewall, and preferably this sidewall is curved, and more preferably it contains no sharp corner. After the formation of fin structure 314, a cleaning step may optionally perform to remove the liner layer 306.

Figure 6:
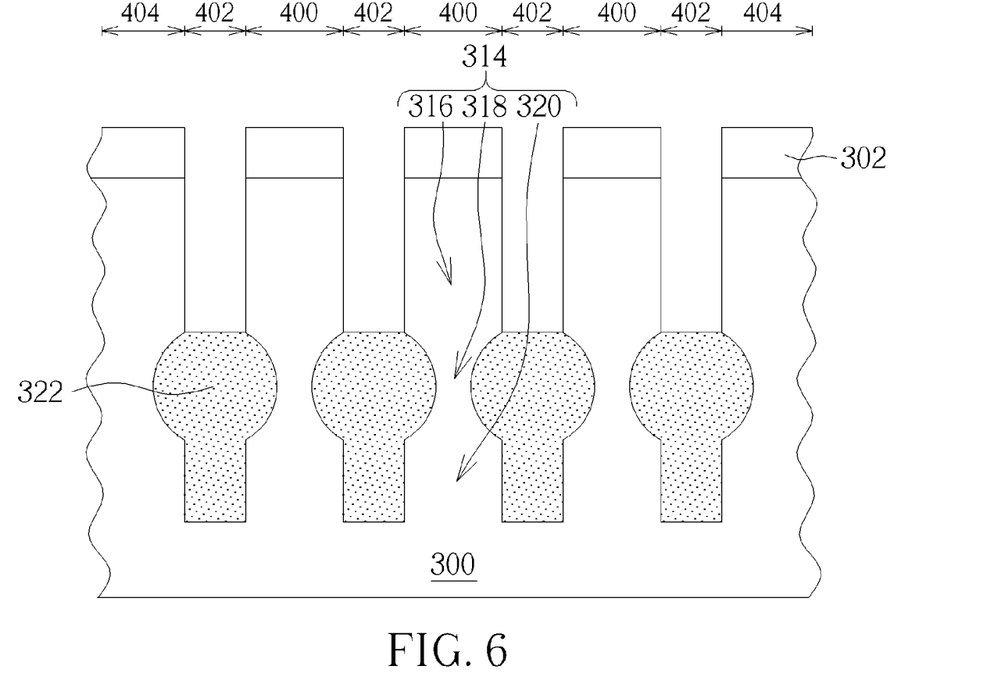

As shown in FIG. 6, an insulating layer is filled into the shallow trench 312 to form a shallow trench isolation (STI) 322 in the isolation region 402. In one embodiment, the insulating layer comprises silicon dioxide or other suitable insulating material. The method of forming the STI 322 includes, for example, using a spin-on-glass (SOG) process, a sub-atmospheric pressure CVD (SACVD) or a high-density plasma CVD (HDPCVD) to fill the shallow trench 312 with the insulating material. After using a chemical mechanical polishing (CMP) process with using the patterned mask layer 302 as an etching stop layer, then an etching back process is performed to completely remove the insulating material in the active region 400 and the peripheral region 404, and further remove the insulating material in the isolation region 402 below the substrate 300. Thus, the STIs 322 are formed. In one embodiment, the top surface of the STI 322 is above the concave portion 314 of the fin structure 314, and preferably, the top surface of the STI 322 is leveled with the boundary of the concave portion 314 and the upper portion 316.

Figure 7:
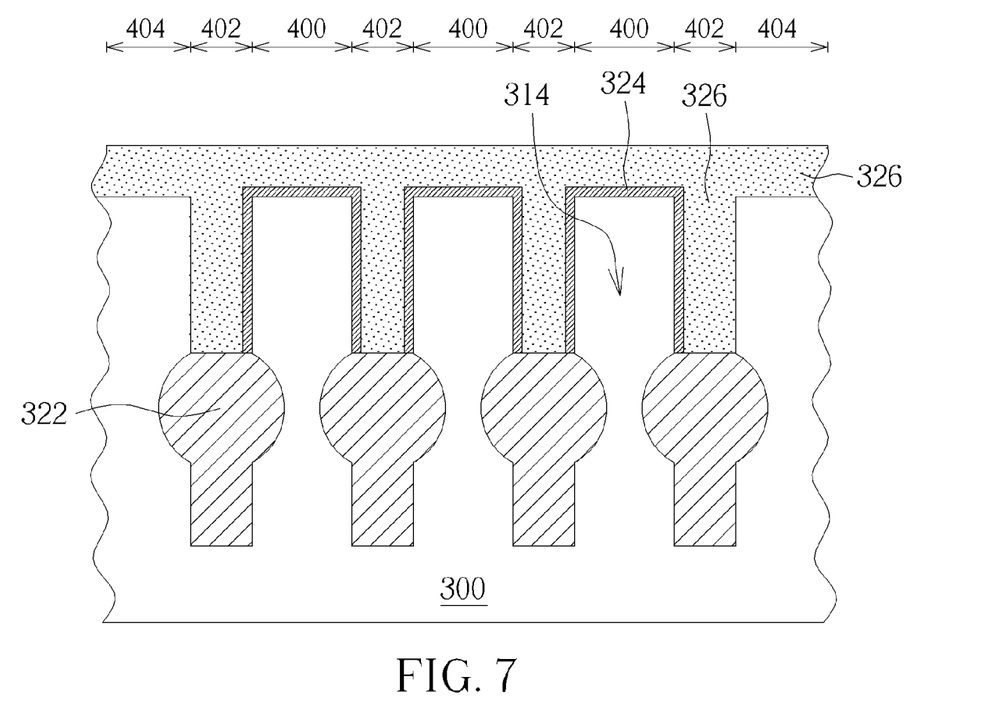

Next, as shown in FIG. 7, agate dielectric layer 324 is formed on the substrate 300, covering on each fin structure 314. In one preferred embodiment of the present invention, the gate dielectric layer 324 contains silicon oxide and is formed by a thermal oxidation process to be uniformly formed on the surface of the fin structure 314. While in another embodiment, the gate dielectric layer 324 may comprise other materials such as high-k dielectric material, by suing an atomic layer deposition (ALD). The high-k dielectric material may include rare earth metal oxide or lanthanide oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. Then, a gate layer 326 is formed on the gate dielectric layer 326. The gate layer 326 may comprise a variety of conductive materials, for example, polysilicon or a meta such as aluminum (Al), titanium (Ti), tantalum (Ta), tungsten (W), niobium (Nb), molybdenum (Mo), copper (Cu), titanium nitride (TiN), titanium carbide (TiC), tantalum nitride (TaN), titanium/tungsten (Ti/W) or titanium/titanium nitride (Ti/TiN) or other metal composite material, but is not limited thereto.

Figure 8:
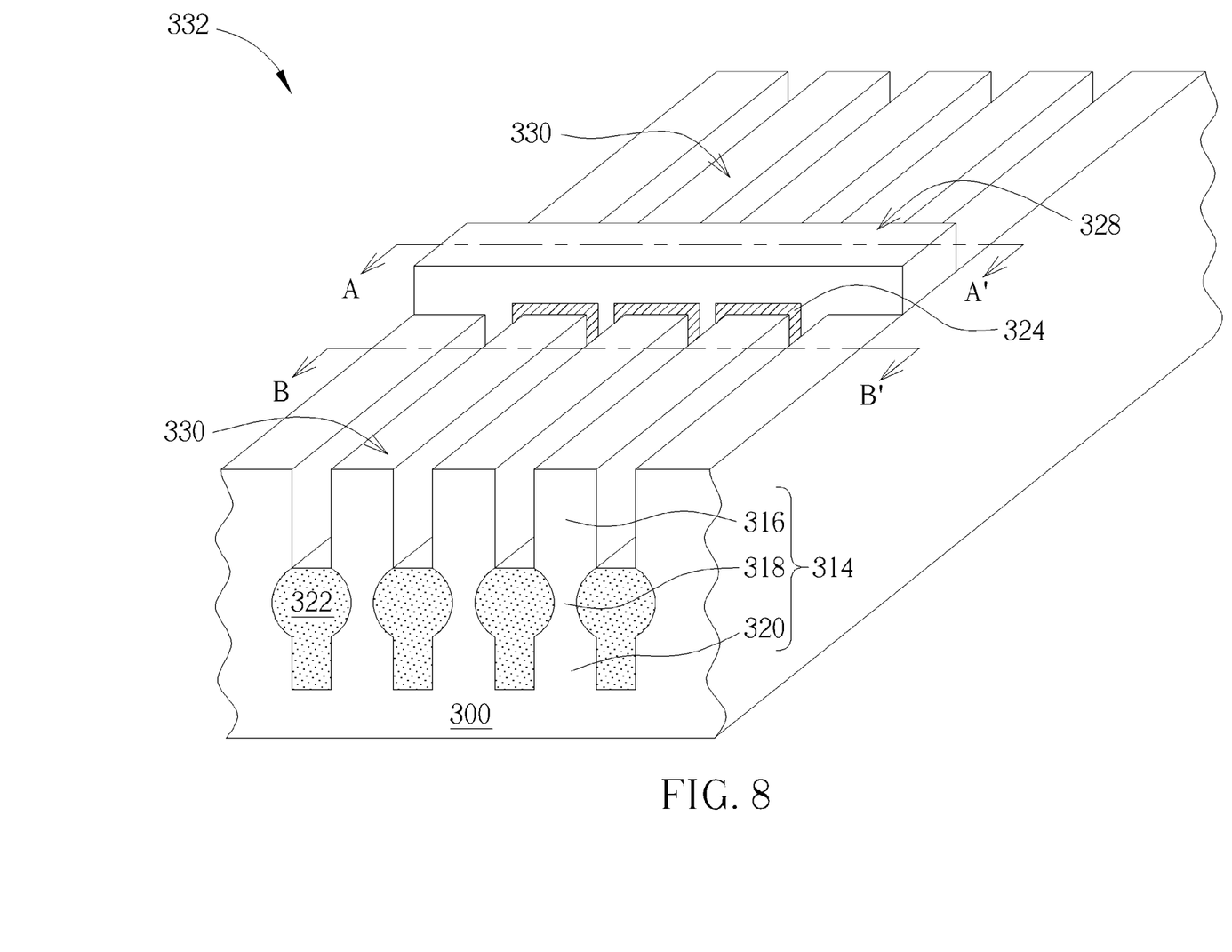

Next, please see FIG. 8, which is a three dimensional view in which FIG. 1 to FIG. 7 are cross-sectional view correspond to line AA'. The gate layer 326 and the gate dielectric layer 324 are patterned so that the gate layer 326 become a gate structure 328. Follow-up, an ion implantation process can be performed to form a source/drain region 330 in the upper portion 316 of the fin structure 314 on two sides of the gate structure 328. Consequently, anon-planar transistor 322 as shown in FIG. 8 can be provided. One feature of the present invention in that the concave portion 318 of the fin structure 318 has a second width $W_2$ smaller than the first width $W_1$ of the upper portion 316. By doing this, the leakage current can be avoided. In addition, since the sidewall of the concave portion 318 is curved without sharp corners, tip corner current can also be avoided.

Figure 9:
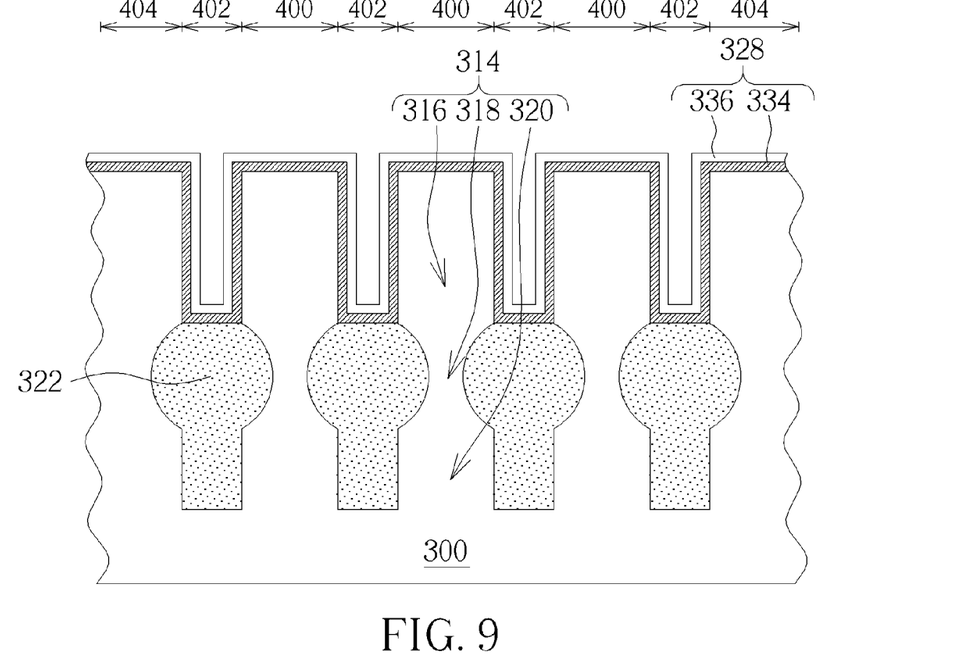
FIG. 9 to FIG. 14 show schematic diagrams of the method of forming a non-planar transistor according to another embodiment of the present invention.

To further enhance the electrical performance of the non-planar transistor 322, please continue to see FIG. 9 to FIG. 14, which is sectional view drawn along line BB' in FGI. 8. As shown in FIG. 9, a composite material layer 338 is comprehensively on the substrate 300, conformally along the exposed surface of the upper portion 316 of the fin structure 314. The composite material layer 338 may comprise two or more than two layers with etching selectivity. Preferably, the composite layers contain materials with the same lattice structure, such as silicon (Si). More preferably, the concentration of the silicon increases from bottom. Taking FIG. 9 for example, the composite material layer 338 comprises a first material layer 334 and a second material layer 336. The first material layer 336 and the second material layer 336 contain silicon nitride (SiN), silicon carbide (SiC) or nitrogen silicon oxide (SiON). The first material layer 334 has an etching selectivity with respect to the second material layer 336, for example, a concentration of silicon or germanium of the second material layer 336 is greater than that of the first material layer 334. The material of the first material layer 334 can be the same or can be different from that of the second material layer 336. For example, the first material layer 334 contains silicon nitride (SiN) and the second material layer 336 contains silicon carbide (SiC).

Figure 10:
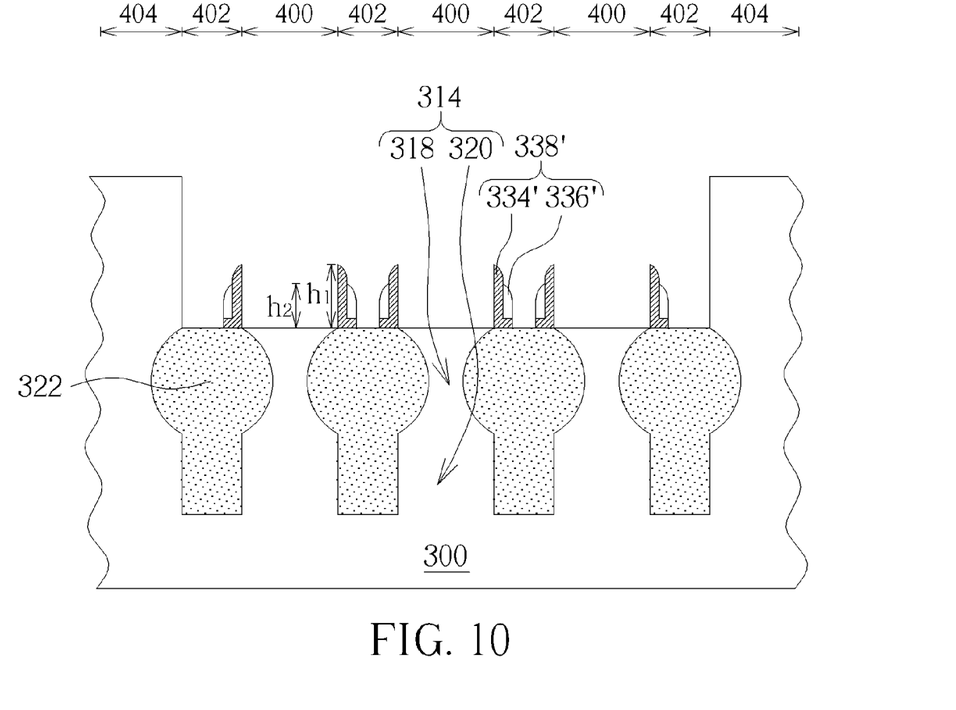
Figure 11:
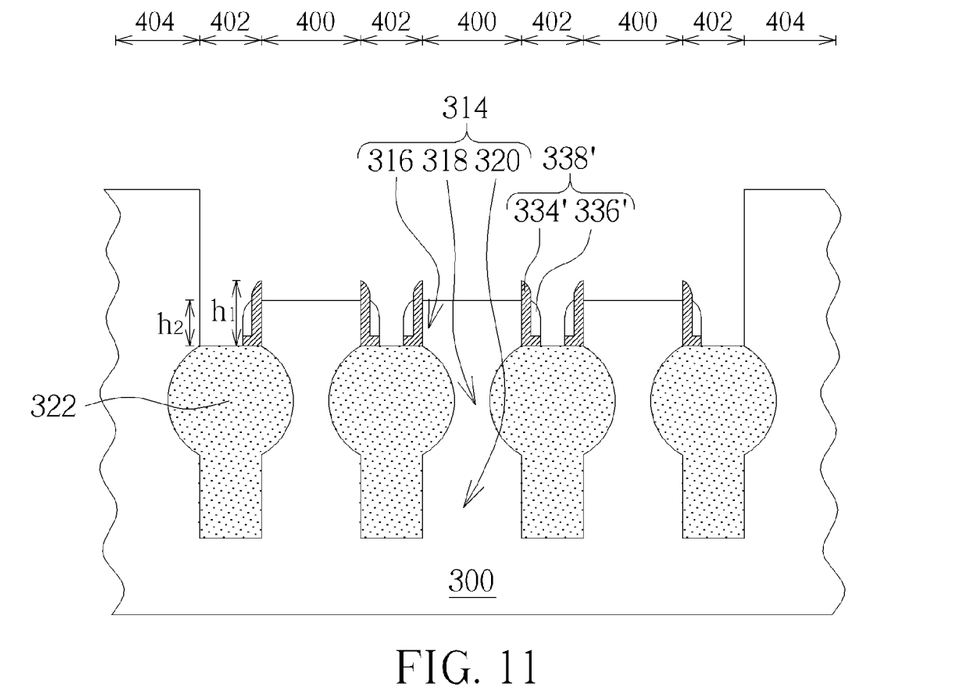
Figure 12:
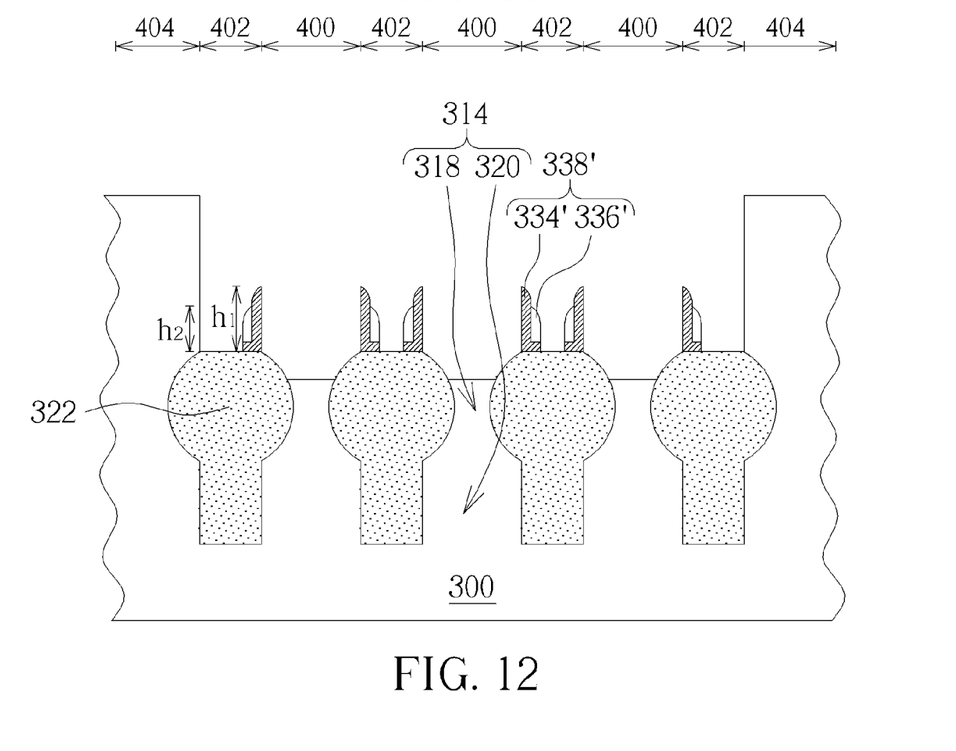
Figure 13:
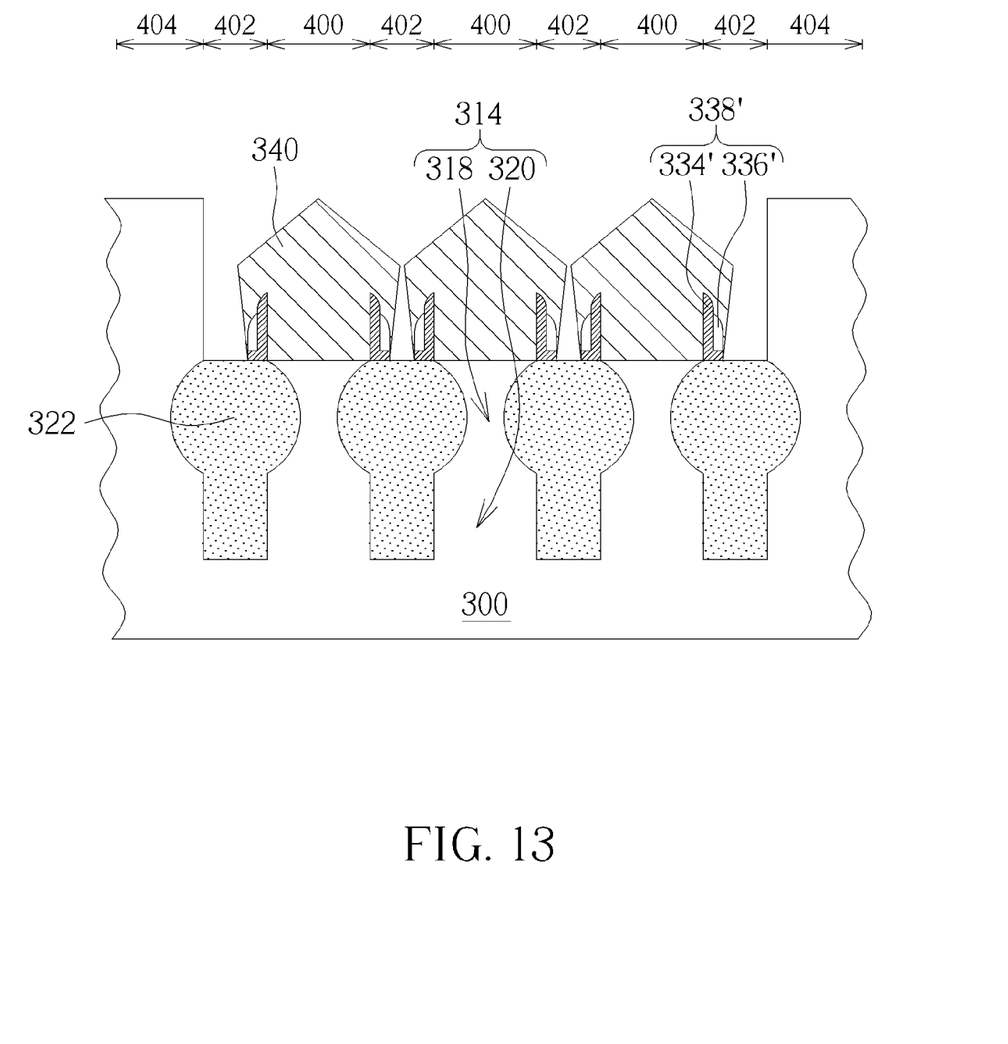

As shown in FIG. 10, at least one anisotropic etching step is performed to remove portions of the fin structure 314 and portion of the composite layer 338, thereby forming a first spacer structure (not shown in FIG. 10) on a sidewall of the gate structure and a second spacer structure 338' on the STI 322. For example, the first material layer 334 becomes a first spacer in the first spacer structure and a third spacer 334' in the second spacer structure 338', and the second material layer 336 becomes a second spacer in the first spacer structure and a fourth spacer 336' in the second spacer structure 338'. It is worth noting that, since the first material layer 334 and the second material layer 336 have an etching selectivity, meaning that the etching speed of the second material layer 336 is faster than the first material layer 334, the formed third spacer 336' has a first height h1 greater a second height h2 of the fourth spacer 336', and a height of the first spacer is also greater than a height of the second spacer. Preferably, the third spacer 336' has an L-shaped cross-section. In one embodiment, the step of forming the second spacer structure 338' can be performed separately from the step of removing the fin structure 314. In one embodiment, as shown in FIG. 10, the fin structure 314 protruding over the STI 322 (such as the upper portion 316) is completely removed. In another embodiment, some portion of the fin structure 314 over the STI 322 can be retained and there is still portions of the fin structure 314 above shallow trench isolation 322. With reference to FIG. 11, there is still portions of the upper 316 protruding over the STI 322, and preferably it is not higher than the third spacer 334'. Alternatively, the fin structure 314 can further be removed till its top surface is lower than STI 322, as shown in FIG. 12, a portion of the concave 318 can be removed, but it is preferably not to remove the most narrow portion of the concave portion 318.

Subsequently, as shown in FIG. 11, the exposed fin structure 314 in the active region 400 is subjected to a selective epitaxial growth process (SEG) to form a semiconductor layer 340. The material of the epitaxial structure 361 may be adjusted according to the type of the MOS transistor. For example, when the MOS transistor is a PMOS, the epitaxial structure 340 may include SiGe, SiGeB, or SiGeSn. In another embodiment of the present invention, when the MOS transistor is NMOS, the epitaxial structure 361 may include SiC, SiCP, or SiP. Besides, the semiconductor layer 340 may be formed by a SEG process through a single or a multiple layer approach, and the heterogeneous atoms (such as germanium or carbon atoms) may also be altered in a gradual arrangement, preferably with the surface of the epitaxial structure 340 having a relative lighter concentration or no germanium at all, to facilitate the subsequent formation of a silicide layer. It is noted that since the material of the third spacer 334', the fourth spacer 336' and the fin structure 314 have the similar lattice structure, the semiconductor layer 340 still can be formed along the sidewalls of the third spacer 334' and the fourth spacer 336' and further protrude over the second spacer structure 338'. Since the fourth spacer 336' has a relatively higher silicon content, the semiconductor layer 340 can be grown slightly outwardly, while the third spacer 334' has a less silicon content, the growth of the semiconductor layer 340 is limited by the active region 400. By adjusting the third spacer 334' and the fourth spacer 336', the semiconductor layer 340 can have a desired shape. In one embodiment, the semiconductor layer 340 has a pentagonal shape or an octagonal shape in the cross-sectional shape. Alternatively, the semiconductor layer 340 can have other shapes.

Figure 14:
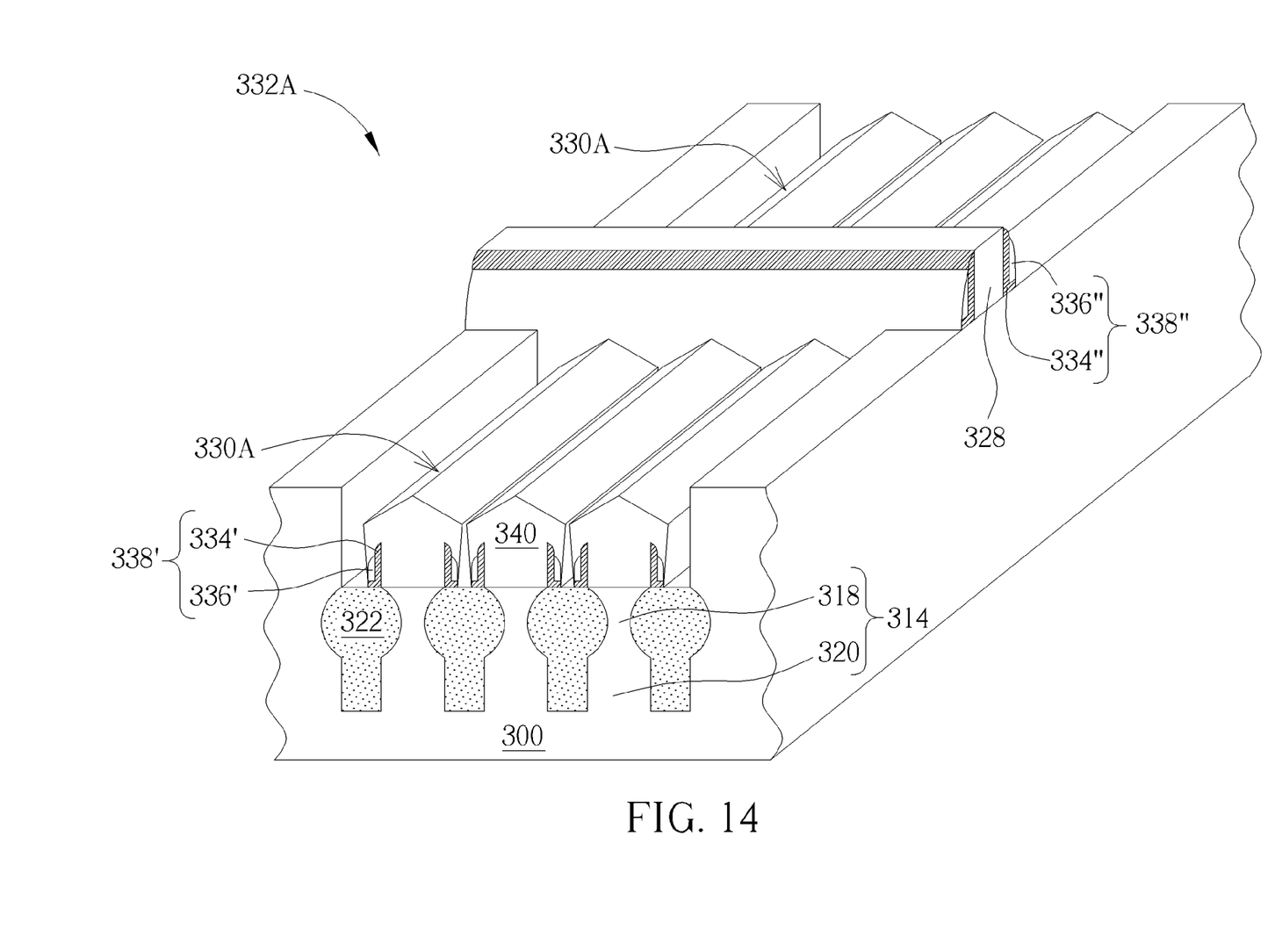

As shown in a perspective view in FIG. 14, an ion implantation process is performed to form a source/drain region 330A in a portion or all of the semiconductor layer 340 at two sides of a first spacer structure 338" that is located on the sidewall of the gate structure 328. However, in another embodiment, the formation of the source/drain 330A may also be in-situ formed during the SEG process. For example, when the MOS transistor is a PMOS, the semiconductor layer 340 includes SiGe, SiGeB or SiGeSn which may be doped in-situ with P type dopants to form a P+ semiconductor layer thereby; or when the MOS transistor is a NMOS, the semiconductor layer 340 include SiC, SiCP or SiP which may be doped in-situ with N type dopants to form a N+ semiconductor layer thereby. Thus, the following ion implantation process for forming the source/drain of PMOS/NMOS may be omitted. Also, in another one embodiment of the present invention, the dopants of source/drain 330A may either be altered in a gradual arrangement. With the above steps, a non-planar transistor 322A as shown in FIG. 14 is provided. In one embodiment, an inter-layer dielectric layer (ILD) (not shown) can further be formed on the non-transistor 322A of FIG. 14 (or the non-planar transistor 322 of FIG. 8) and contact plugs can be formed therein to provide input/output signal.

According to FIG. 14, a non-planar transistor 322A is provided. It includes a substrate 300, a fin structure 314, a gate structure 328, a first spacer structure 338", a second spacer structure 338'and a source/drain region 330A. The fin structure 314 is disposed on the substrate 300, the gate structure 328 is disposed on the fin structure 314. The first spacer structure 338" is disposed on a sidewall of the gate structure 328, and the second spacer structure 338' is disposed on the STI 322. The first spacer structure 338" includes a first spacer 334" and a second spacer 336". The first spacer 334" is disposed between the gate structure 328 and the second spacer 336", and a height of the first spacer 334" is greater than a height of the second spacer 336". The second spacer structure 338' includes a third spacer 334' with a first height h1 and a fourth spacer 336' with a second height h2, wherein the third spacer 334' is disposed between the fourth spacer 336'. The source/drain region 330A is disposed in a semiconductor layer 340 at two sides of the first spacer structure 338'. In one embodiment, the semiconductor layer 340 protrudes over the third spacer 334' and covers an outer sidewall of the third spacer 334'. In another embodiment, the semiconductor layer 340 further covers an outer sidewall of the fourth spacer 336', such that the second spacer structure 338' of the source/drain region 330A is completely surrounded by the semiconductor layer 340. In another embodiment, as shown in FIG. 8, the source/drain region 330 is located in the semiconductor material of the fin structure 314. In this embodiment, the semiconductor layer refers to a part of the fin structure 314.

In summary, the present invention provides a non-planar transistor and a method of forming the same. It is featured that the fin structure includes the concave portion to avoid leakage current. Further, the novel spacer structure can control the shape and the size of the semiconductor layer, thereto enhance the electrical performance of the non-planar transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a non-planar transistor, comprising:
    forming a fin structure on a substrate;
    forming a gate structure on the fin structure;
    forming a spacer structure on a sidewall of the gate structure, wherein the spacer structure comprises a first spacer and a second spacer, the first spacer is disposed between the gate structure and the second spacer, and a height of the first spacer is different from a height of the second spacer; and
    forming a source/drain region in the fin structure at one side of the spacer structure, wherein the step of forming the fin structure comprises:
        providing at least an active region and an isolation region encompassing the active region;
        performing an isotropical etching process to form a first trench in the isolation region;
        performing an anisotropical etching process to enlarge a bottom surface of the first trench to form a second trench; and
        performing an isotropical etching process to deepen a bottom surface of the second trench to form a third trench, making the substrate in the active region become the fin structure.

2. The method of forming a non-planar transistor according to claim 1, wherein the fin structure comprises an upper portion, a concave portion and a lower portion.

3. The method of forming a non-planar transistor according to claim 2, wherein the concave portion is recessed toward the fin structure and has a curved sidewall.

4. The method of forming a non-planar transistor according to claim 1, wherein the semiconductor layer is a part of the fin structure.

5. The method of forming a non-planar transistor according to claim 1, wherein the step of forming semiconductor layer comprises:
    removing a part of the fin structure; and
    performing a selectively epitaxial growth (SEG) process to form the semiconductor layer.

6. The method of forming a non-planar transistor according to claim 1, wherein the step of forming the spacer structure comprises:
    forming a first material layer on the substrate;
    forming a second material layer on the first material layer; and
    performing an isotropical etching process to make the first material layer become the first spacer and make the second material layer become the second spacer.

7. The method of forming a non-planar transistor according to claim 6, wherein when performing the isotropical etching process, removing a part of the fin structure simultaneously, and then performing an SEG process to form the semiconductor layer.

8. The method of forming a non-planar transistor according to claim 1, wherein the spacer structure comprises silicon nitride, silicon carbide or silicon oxynitride.

9. The method of forming a non-planar transistor according to claim 6, wherein a silicon concentration of the first spacer is less that of the second spacer.

* * * * *